(12) United States Patent
Peng

(10) Patent No.: US 6,876,144 B2
(45) Date of Patent: Apr. 5, 2005

(54) ORGANIC ELECTROLUMINESCENT DEVICE HAVING HOST MATERIAL LAYER INTERMIXED WITH LUMINESCENT MATERIAL

(76) Inventor: Kuan-Chang Peng, No. 8, LN 213, Sec. 2, Jingguo Rd., Hsinchu (TW), 300

( * ) Notice: Subject to any disclaimer, the term of this patent is extended or adjusted under 35 U.S.C. 154(b) by 0 days.

(21) Appl. No.: 10/429,773

(22) Filed: May 6, 2003

(65) Prior Publication Data

US 2004/0046495 A1 Mar. 11, 2004

(30) Foreign Application Priority Data

Sep. 9, 2002 (TW) ........................................ 91120391 A

(51) Int. Cl.[7] .............................. H01J 1/62; H01J 63/04
(52) U.S. Cl. ........................ 313/504; 313/506; 313/503; 257/79; 257/40; 257/102; 428/690
(58) Field of Search .................................. 313/504, 502, 313/503, 506, 508; 257/79, 88, 89, 102, 40; 428/690, 917

(56) References Cited

U.S. PATENT DOCUMENTS 6,661,023 B2 * 12/2003 Hoag et al. ................... 257/40
6,717,358 B1 * 4/2004 Liao et al. ................... 313/504
6,765,349 B2 * 7/2004 Liao et al. ................... 313/504
2004/0104394 A1 * 6/2004 Lin et al. ....................... 257/79

* cited by examiner

Primary Examiner—Joseph Williams
Assistant Examiner—Kevin Quarterman
(74) Attorney, Agent, or Firm—Rosenberg, Klein & Lee

(57) ABSTRACT

The present invention discloses a white light emitting organic electroluminescent (EL) device able to directly emit continuous full color light containing three different frequency bands and a method for manufacturing such an organic electroluminescent device. The device comprises: a first conductive layer having a first conductive type; a first carrier transmission layer; a second carrier blocking layer; a first host material layer formed on the first conductive layer, wherein the first host material layer is doped with a first guest luminescent material so as to cast a first color light source under a bias voltage; a second host material layer formed on the first host material layer, wherein the second host material layer is doped with a second guest luminescent material so as to cast a second color light source under the bias voltage; a third host material layer formed on the second host material layer, wherein the third host material layer is doped with a third guest luminescent material so as to cast a third color light source under the bias voltage; a first carrier blocking layer; a second carrier transmission layer; and a second conductive layer having a second conductive type formed on the third host material layer.

25 Claims, 2 Drawing Sheets

ORGANIC ELECTROLUMINESCENT DEVICE HAVING HOST MATERIAL LAYER INTERMIXED WITH LUMINESCENT MATERIAL

BACKGROUND OF THE INVENTION

1. Field of the Invention

The present invention generally relates to an organic light-emitting device (also known as OLED) and a method for manufacturing the same and, more particularly, to a white light emitting organic electroluminescent (EL) device able to directly cast continuous full color light containing three different frequency bands and a method for manufacturing such an organic electroluminescent device.

2. Description of the Prior Art

The organic electroluminescent device, upon which C. W. Tang and S. A. Van Slyke (Eastman Kodak Company, Rochester, N.Y.) have made efforts since 1987 so as to deposit hole/electron transmission materials such as aluminum trisoxine [a.k.a., tris (8-quinolinol) aluminum] by vacuum evaporation on an indium-tin oxide (ITO) glass followed by the deposition of a metal electrode, has attracted tremendous attention due to its advantages over other display panels. These advantages include self-luminescence, large visual angle, short response time, compact size, light weight, reduced dimension in thickness, high brightness, low power consumption, simple fabrication, and the ability for light emitting in a full color range. Therefore, such an organic electroluminescent device is increasingly required to replace the currently used white light sources such as fluorescent lamps and light bulbs so as to save energy, and the technologies thereon have widely been studied in the industry all over the world.

Please refer to FIG. 1, which is a cross-sectional view showing the structure of an organic EL device disclosed in U.S. Pat. No. 4,769,292, issued Sep. 6, 1988, filed Oct. 14, 1987 by Van Slyke et al (Eastman Kodak Company, Rochester, N.Y.), entitled "Electroluminescent device with modified thin film luminescent zone." The organic EL device 10 comprises in sequence: a transparent substrate 11, a light transmission anode 13 formed of tin oxide or indium-tin oxide (ITO) by evaporation, a hole transmission layer (HTL) 15, a luminescent layer 17, and a metal cathode 19. The luminescent layer 17 is formed by a thin film comprised of an organic host material capable of sustaining hole and electron injection and a fluorescent material (not shown) capable of emitting light in response to electron-hole recombination. When an external voltage across the anode 13 and the cathode 19 is applied to the device 10, the anode 13 injects holes (positive charge carriers) through the hole transmission layer 15 into the luminescent layer 17 while the cathode 19 injects electrons through the hole transmission layer 15 into the luminescent layer 17. The portion of the luminescent layer 17 adjacent the anode 13 thus forms a hole injecting and transporting zone 15. The injected holes and electrons each migrate toward the oppositely charged electrode. This results in electron-hole recombination to form an exciton within the organic luminescent medium 17, which leads to energy released as light according to the chosen fluorescent material.

The afore-mentioned prior art organic EL device has advantages in good quality and enduring lifetime. However, the structure employed can only cast monochromatic lights according to various chosen fluorescent materials, and fail to achieve the objects of emitting white light or continuous full color light.

Please refer to FIG. 2, which is a schematic band diagram showing the structure of an organic EL device disclosed in U.S. Pat. No. 5,668,438, issued Sep. 16, 1997, filed Jun. 6, 1996 and U.S. Pat. No. 5,886,464, issued Mar. 23, 1999, filed Apr. 18, 1997 by Shi et al (Motorola, Inc., Schaumburg, Ill.), both entitled "Organic electroluminescent device with emission from hole transmission layer." In the EL structure, an anode 22 is formed of tin oxide or indium tin oxide (ITO), an organic hole transmission layer (HTL) 23 is formed on the anode 22, an organic electron transmission layer (ETL) 24 is formed on the hole transmission layer 23, and a cathode 25 is formed on the electron transmission layer 24. The materials for the hole and electron transmission layers 23 and 24 are so selected as to satisfy the following inequality:

$$(E_{C1}-E_{C2})<(E_{V1}-E_{V2})$$

where $E_{C1}$ and $E_{V1}$ respectively represent a conduction band level and a valence band level of the material selected for the hole transmission layer 23; and $E_{C2}$ and $E_{V2}$ respectively represent a conduction band level and a valence band level of the material selected for the electron transmission layer 24.

The inequality ensures that the energy barrier for holes to be injected into the valence band of electron transmission layer 24 from the valence band of hole transmission layer 23 is greater than that for electrons to be injected into the conduction band of the hole transmission layer 23 from the conduction band of electron transmission layer 24. In other words, the number of electrons to be injected from the electron transmission layer 24 into the hole transmission layer 23 is much larger than the number of holes to be injected from the hole transmission layer 23 into the electron transmission layer 24. Therefore, electrons and holes recombine in the part of hole transmission layer 23 close to the interface of electron transmission layer 24 and hole transmission layer 13, where light emission occurs. Moreover, in order to facilitate holes to be injected into the hole transmission layer 23 from the anode 22, the EL structure further provides a hole injection layer interposed between the anode 22 and the hole transmission layer 23.

Although the afore-mentioned prior art organic EL device has high electroluminescence efficiency due to light emission from the hole transmission layer 23. However, the structure employed can only cast monochromatic lights according to various chosen fluorescent materials, and fail to achieve the objects of emitting white light or continuous full color light.

In recent years, there are several methods that have been investigated and developed by the industry to realize an organic EL device capable of emitting white light or full color light, including:

1. Color conversion: In this method, a monochromatic light passes through a color conversion material composed of different color conversion layers and is then resolved and converted into light with different colors, e.g. three primary colors, such as red, blue, and green so that an organic EL device capable of emitting white light or full color light can be obtained. However, this method also suffers from a number of problems. First, for example, most of the available color conversion materials are not satisfactory in color purity and luminescence efficiency. Secondly, the background light (such as blue light and UV light) may also be absorbed by the color conversion layers, which often leads to poor contrast and defective pixel quality.

2. Color filter: In this method, white light is used as the back-lighting source of the organic EL material. It is useful to achieve full color light when accompanied by LCD color filters. However, the key problem of this method is how to obtain a reliable white light.

3. Three independent colors (RBG): In this method, three primary colors red (R), green (G) and blue (B) are independently demonstrated to realize a full color display or a white light source. However, since the three colors are independently demonstrated, RBG pixels require different driving voltages. It suffers from complicated fabrication process and larger size. In addition, in such a device, high precision is critically required for the RBG pixels. It is found that the fabrication process may be difficult and complicated. On one hand, the RBG pixels formed of three different organic EL materials may have different luminescence efficiencies, lifetimes, driving conditions. For example, the red light shows poor purity and may shift to orange color. The red light also has shorter lifetime and may adversely affect the overall performance of the display. On the other hand, the method is performed by a two-wavelength approach; therefore, chromatic aberration may occur.

Therefore, the present invention has been made to solve such problems in view of the forgoing status and to further provide a method for manufacturing a white light emitting organic electroluminescent (EL) device able to directly cast continuous full color light containing three different frequency bands so as to realize white light emitting.

SUMMARY OF THE INVENTION

It is the primary object of the present invention to provide an organic electroluminescent device, characterized in that optimal light distribution of light densities of three different frequency bands is achieved to realize continuous white/full color light.

It is another object of the present invention to provide a method for manufacturing an organic electroluminescent device, so as to overcome the afore-mentioned problems in manufacturing a white/full color display.

It is still another object of the present invention to provide an organic electroluminescent device and a method for manufacturing the same, incorporating host material layers and guest luminescent materials so as to enhance the luminescence efficiency and to prolong the lifetime.

In order to achieve the foregoing objects, the present invention provides an organic electroluminescent device, comprising: a first conductive layer having a first conductive type; a first host material layer formed on the first conductive layer, wherein the first host material layer is intermixed with a first guest luminescent material so as to cast a first color light source under a bias voltage; a second host material layer formed on the first host material layer, wherein the second host material layer is intermixed with a second guest luminescent material so as to cast a second color light source under the bias voltage; a third host material layer formed on the second host material layer, wherein the third host material layer is intermixed with a third guest luminescent material so as to cast a third color light source under the bias voltage; and a second conductive layer having a second conductive type formed on the third host material layer.

The present invention further provides a method for manufacturing an organic electroluminescent (EL) device, comprising steps of: forming a first host material layer on an anode, wherein the first host material layer is further intermixed with a first guest luminescent material; forming a second host material layer on the first host material layer, wherein the second host material layer is further intermixed with a second guest luminescent material; forming a third host material layer on the second host material layer, wherein the third host material layer is further intermixed with a third guest luminescent material; and forming a cathode on the third host material layer; wherein the first host material layer casts a first color light source, the second host material layer casts a second color light source, and the third host material layer casts a third color light source under a bias voltage.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing an organic light-emitting device and a method for manufacturing the same can be exemplified by the preferred embodiments as described hereinafter.

Figure 1:
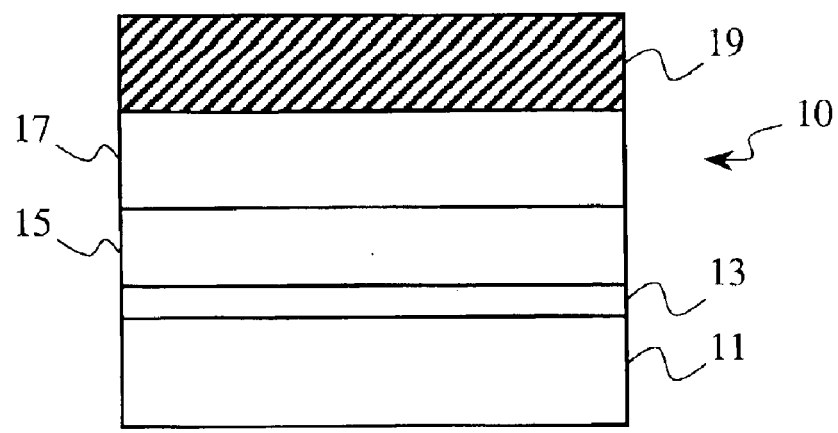
FIG. 1 is a cross-sectional view showing the structure of an organic EL device in accordance with the prior art.
Figure 2:
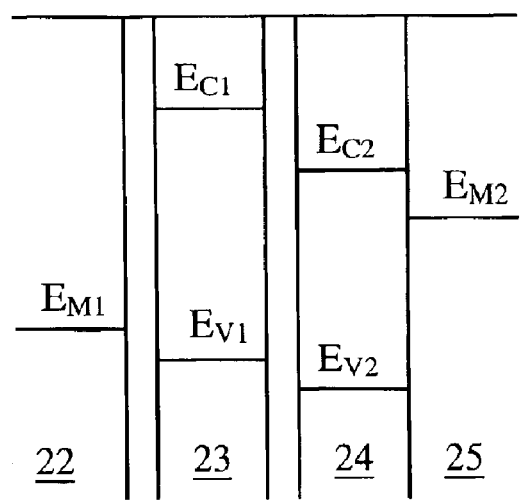
FIG. 2 is a schematic band diagram showing the structure of another organic EL device in accordance with the prior art.
Figure 3:
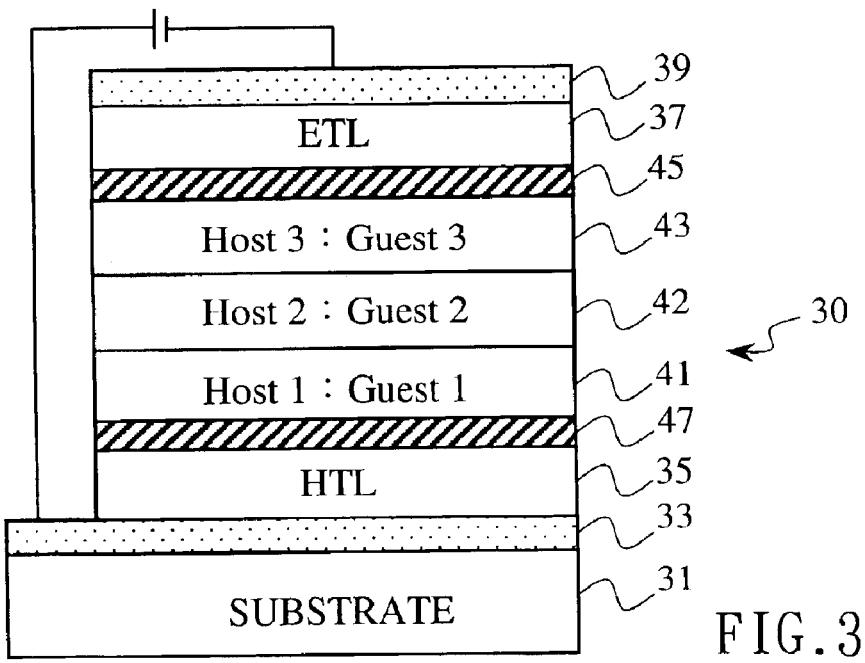
FIG. 3 is a cross-sectional view showing the structure of an organic EL device in accordance with one preferred embodiment of the present invention.

To start with, please refer to FIG. 3, which is a cross-sectional view showing the structure of an organic EL device in accordance with one preferred embodiment of the present invention. As shown in the drawing, the organic EL device 30 comprises: a transparent substrate 31; a first conductive layer 33 such as an anode formed by evaporation or sputtering on the transparent substrate 31; a first carrier transmission layer 35 (hole transmission layer, HTL) formed of materials such as N,N'-bis-(1-naphthy)-N,N'diphenyl-1,1'-biphenyl-4-4'-diamine (NPB) on the anode 33; a second carrier blocking layer 47 (electron blocking layer) formed of LiF on the first carrier transmission layer 35 for blocking the second carriers (electrons); a first host material layer 41 (Host 1) formed of NPB, a second host material layer 42 (Host 2) formed of DPVBi and a third host material layer 43 (Host 3) formed of Alq3 on the second carrier blocking layer 47; a first carrier blocking layer 45 (hole blocking layer) formed of BCP on the third host material layer 43 for blocking the first carriers (holes); a second carrier transmission layer 37 (electron transmission layer, ETL); and a cathode 39.

The electron blocking layer 47 blocks the electrons from the cathode 39 on the topside of the hole transmission layer 35. In other words, the electrons are confined within the third host material layer 43 (Host 3), the second host material layer 42 (Host 2) and the first host material layer 41 (Host 1). Moreover, the hole blocking layer 45 blocks the holes from the anode 33 on the bottom side of the electron transmission layer 37. In other words, the holes are confined within the first host material layer 41 (Host 1), the second host material layer 42 (Host 2) and the third host material layer 43 (Host 3). Since most of the electrons and the holes are introduced and confined within the first host material layer 41 (Host 1), the second host material layer 42 (Host 2) and the third host material layer 43 (Host 3), electron-hole recombination may occur in these host material layers such that the light-emitting efficiency is increased.

The first host material layer 41 is intermixed with a first guest luminescent material (Guest 1). Similarly, the second host material layer 42 is intermixed with a second guest luminescent material (Guest 2) and the third host material layer 43 is intermixed with a third guest luminescent material (Guest 3). Since these guest luminescent materials are selected from a group including a luminescent medium, a phosphorescent medium and combination thereof, different color light sources may be castted by the excitons during electron-hole recombination. For example, in the present embodiment, the first guest luminescent material (Guest 1) is responsible for the red light (R), the second guest luminescent material (Guest 2) is responsible for the blue light (B), and the third guest luminescent material (Guest 3) is responsible for the green light (G). Three primary color light sources can be castted from the same device such that the device casts continuous full color light containing three different frequency bands. The device thus features ease in fabrication and high luminescence efficiency.

Certainly, according to the standard CIE (International Commission on Illumination) chromaticity diagram, the intensity of the green light is required to be larger than that of the red light and that of the blue light. Therefore, in the present embodiment, the doping of the third guest luminescent material (Guest 3) is higher than that of the first guest luminescent material (Guest 1) and that of the second guest luminescent material (Guest 2). Moreover, the number of electron-hole pairs in the third host material layer 43 (Host 3) is designed to be larger than that of the first host material layer 41 (Host 1) and that of the second host material layer 42 (Host 2). The arrangement of these host material layers 41, 42, 43 is based on the composite band diagram.

Figure 4:
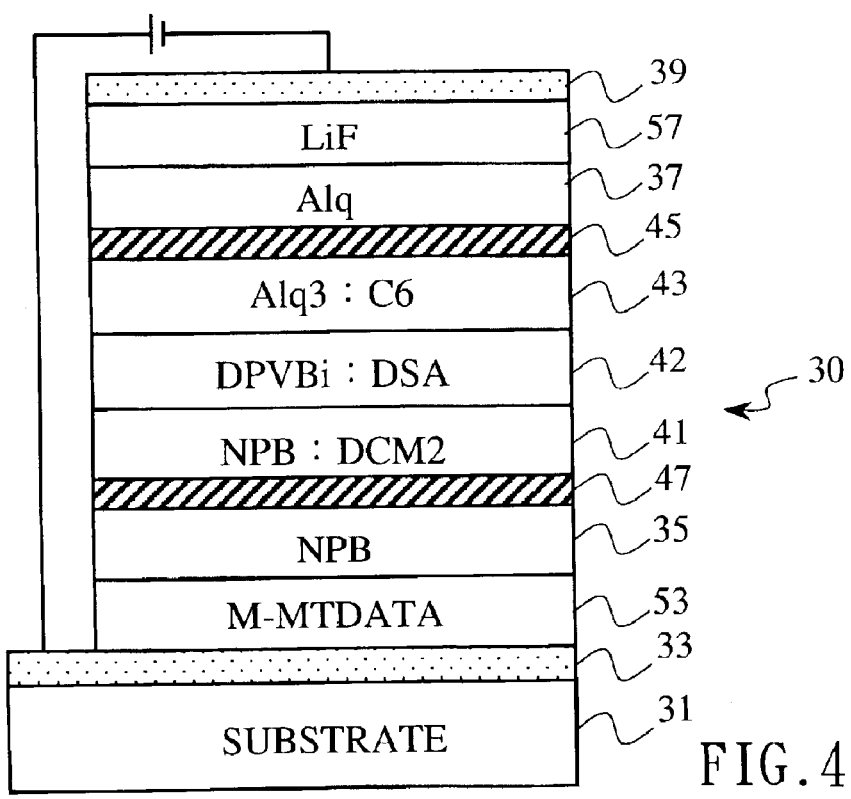
FIG. 4 is a cross-sectional view showing the structure of an organic EL device in accordance with another preferred embodiment of the present invention.

Please further refer to FIG. 4, which is a cross-sectional view showing the structure of an organic EL device in accordance with another preferred embodiment of the present invention. As shown in FIG. 4, the organic EL device 30 comprises: a transparent substrate 31 formed of glass, quartz or plastic; a first conductive layer 33 such as an anode formed of metal, alloys, and compounds such as indium-tin oxide (ITO), polyaniline (PANI), $ZnO_x$, $MoO_x$, $VO_x$, $RuO_x$, Au, CuI, $SnO_2$, ZnO, etc. by evaporation or sputtering on the transparent substrate 31; a first carrier injection layer 53 (hole injection layer, HIL) formed of M-MTDATA on the anode 33; a first carrier transmission layer 35 (hole transmission layer, HTL) formed of N,N'-bis-(1-naphthy)-N, N'diphenyl-1,1'-biphenyl-4-4'-diamine (NPB) on the first carrier injection layer 53; a second carrier blocking layer 47 (electron blocking layer) formed of LiF on the first carrier transmission layer 35 for blocking the second carriers (electrons); a first host material layer 41 (Host 1) formed of NPB, a second host material layer 42 (Host 2) formed of DPVBi and a third host material layer 43 (Host 3) formed of Alq3 on the second carrier blocking layer 47; a first carrier blocking layer 45 (hole blocking layer) formed of BCP on the third host material layer 43 for blocking the first carriers (holes); a second carrier transmission layer 37 (electron transmission layer, ETL) formed of Alq on the first carrier blocking layer 45; a second carrier injection layer 57 (electron injection layer, EIL) formed of LiF on the second carrier transmission layer 37; and a cathode 39 formed of metal, alloys and compounds such as Au, Al, Mg, Pt, Ag, MgAg, AlLi, AlLiO, AlLiF and Ca.

More particularly, the first host material layer 41 formed of NPB is intermixed with a first guest luminescent material (Guest 1) formed of DCM2 so as to cast a red light source under a bias voltage. Similarly, the second host material layer 42 formed of DPVBi is intermixed with a second guest luminescent material (Guest 2) formed of DSA so as to cast a blue light source and the third host material layer 43 formed of Alq3 is intermixed with a third guest luminescent material (Guest 3) formed of C6 so as to cast a green light source under a bias voltage. The arrangement of these host material layers 41, 42, 43 is based on the composite band diagram. Therefore, the electron blocking layer 47 blocks the electrons from the cathode 39 on the topside of the hole transmission layer 35. In other words, the electrons are confined within the third host material layer 43 (Alq3), the second host material layer 42 (DPVBi) and the first host material layer 41 (NPB). Moreover, the hole blocking layer 45 blocks the holes from the anode 33 on the bottom side of the electron transmission layer 37. In other words, the holes are confined within the first host material layer 41 (NPB), the second host material layer 42 (DPVBi) and the third host material layer 43 (Alq3). Since most of the electrons and the holes are introduced and confined within the first host material layer 41 (NPB), the second host material layer 42 (DPVBi) and the third host material layer 43 (Alq3), electron-hole recombination may occur in these host material layers such that the light-emitting efficiency is increased. Furthermore, these guest luminescent materials are selected from a group including a luminescent medium, a phosphorescent medium and combination thereof, different color light sources may be castted by the excitons during electron-hole recombination. Three primary color light sources can be emitted from the same device such that the device casts continuous full color light containing three different frequency bands. The device thus features ease in fabrication and high luminescence efficiency.

According to the standard CIE (International Commission on Illumination) chromaticity diagram, the intensity of the green light is required to be larger than that of the red light and that of the blue light. Therefore, in the present embodiment, the doping of the third guest luminescent material (C6) is higher than that of the first guest luminescent material (DCM2) and that of the second guest luminescent material (DSA). Moreover, the thickness of the third host material layer 43 (Alq3) is designed to be larger than that of the first host material layer 41 (NPB) and that of the second host material layer 42 (DPVBi).

In the present invention, the materials used in the other layers can be referred to the prior arts such as U.S. Pat. No. 5,294,870 for the ETL or the HTL, U.S. Pat. Nos. 5,061,569 and 5,256,945 for the HTL, U.S. Pat. Nos. 4,539,507 and 5,886,464 for the ETL, U.S. Pat. Nos. 3,935,031 and 4,356,429 for the HIL, U.S. Pat. No. 5,773,929 for the anode, and U.S. Pat. No. 4,539,507 for the EIL.

According to the above discussion, the present invention discloses a white light emitting organic electroluminescent (EL) device able to directly cast continuous full color light containing three different frequency bands and a method for manufacturing such an organic electroluminescent device.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An organic electroluminescent (EL) device, comprising:
    a first conductive layer having a first conductive type;
    a first host material layer formed on the topside of said first conductive layer, wherein said first host material layer is intermixed with a first guest luminescent material so as to cast a first color light source under a bias voltage;
    a second host material layer formed on the topside of said first host material layer, wherein said second host material layer is intermixed with a second guest luminescent material so as to cast a second color light source under said bias voltage;
    a third host material layer formed on the topside of said second host material layer, wherein said third host material layer is intermixed with a third guest luminescent material so as to cast a third color light source under said bias voltage; and
    a second conductive layer having a second conductive type formed on the topside of said third host material layer.

2. An organic electroluminescent (EL) device, comprising:
    a first conductive layer having a first conductive type;
    a second carrier blocking layer formed on the topside of said first conductive layer;
    a first host material layer formed on the topside of said second carrier blocking layer, wherein said first host material layer is intermixed with a first guest luminescent material so as to cast a first color light source under a bias voltage;
    a second host material layer formed on the topside of said first host material layer, wherein said second host material layer is intermixed with a second guest luminescent material so as to cast a second color light source under said bias voltage;
    a third host material layer formed on the topside of said second host material layer, wherein said third host material layer is intermixed with a third guest luminescent material so as to cast a third color light source under said bias voltage; and
    a second conductive layer having a second conductive type formed on the topside of said third host material layer.

3. An organic electroluminescent (EL) device, comprising:
    a first conductive layer having a first conductive type;
    a first host material layer formed on the topside of said first conductive layer, wherein said first host material layer is intermixed with a first guest luminescent material so as to cast a first color light source under a bias voltage;
    a second host material layer formed on the topside of said first host material layer, wherein said second host material layer is intermixed with a second guest luminescent material so as to cast a second color light source under said bias voltage;
    a third host material layer formed on the topside of said second host material layer, wherein said third host material layer is intermixed with a third guest luminescent material so as to cast a third color light source under said bias voltage;
    a first carrier blocking layer formed on the topside of said third host material layer; and
    a second conductive layer having a second conductive type formed on the topside of said first carrier blocking layer.

4. An organic electroluminescent (EL) device, comprising:
    a first conductive layer having a first conductive type;
    a second carrier blocking layer formed on the topside of said first conductive layer;
    a first host material layer formed on the topside of said second carrier blocking layer, wherein said first host material layer is intermixed with a first guest luminescent material so as to cast a first color light source under a bias voltage;
    a second host material layer formed on the topside of said first host material layer, wherein said second host material layer is intermixed with a second guest luminescent material so as to cast a second color light source under said bias voltage;
    a third host material layer formed on the topside of said second host material layer, wherein said third host material layer is intermixed with a third guest luminescent material so as to cast a third color light source under said bias voltage;
    a first carrier blocking layer formed on the topside of said third host material layer; and
    a second conductive layer having a second conductive type formed on the topside of said first carrier blocking layer.

5. The organic EL device as recited in claim 4, wherein said first host material layer is an NPB layer, said second host material layer is a DPVBi layer, and said third host material layer is an Alq3 layer.

6. The organic EL device as recited in claim 4, wherein said first host material layer is an NPB layer and said first guest luminescent material is DCM2.

7. The organic EL device as recited in claim 4, wherein said second host material layer is a DPVBi layer and said second guest luminescent material is DSA.

8. The organic EL device as recited in claim 4, wherein said third host material layer is an Alq3 layer and said third guest luminescent material is C6.

9. The organic EL device as recited in claim 4, wherein the consistency of said third guest luminescent material is higher than that of said first guest luminescent material and said second guest luminescent material.

10. The organic EL device as recited in claim 4, wherein said first guest luminescent material is selected from a group including a luminescent medium, a phosphorescent medium and combination thereof.

11. The organic EL device as recited in claim 4, wherein said second guest luminescent material is selected from a group including a luminescent medium, a phosphorescent medium and combination thereof.

12. The organic EL device as recited in claim 4, wherein said third guest luminescent material is selected from a group including a luminescent medium, a phosphorescent medium and combination thereof.

13. An organic electroluminescent (EL) device, comprising:

a first conductive layer having a first conductive type;

a first carrier transmission layer formed on the topside of said first carrier conductive layer;

a second carrier blocking layer formed on the topside of said first carrier transmission layer;

a first host material layer formed on the topside of said second carrier blocking layer, wherein said first host material layer is intermixed with a first guest luminescent material so as to cast a first color light source under a bias voltage;

a second host material layer formed on the topside of said first host material layer, wherein said second host material layer is intermixed with a second guest luminescent material so as to cast a second color light source under said bias voltage;

a third host material layer formed on the topside of said second host material layer, wherein said third host material layer is intermixed with a third guest luminescent material so as to cast a third color light source under said bias voltage;

a first carrier blocking layer formed on the topside of said third host material layer; and a second conductive layer having a second conductive type formed on the topside of said first carrier blocking layer.

14. An organic electroluminescent (EL) device, comprising;

an anode;

a hole transmission layer formed on said anode;

an electron blocking layer formed on the topside of said hole transmission layer;

a first host material layer formed on the topside of said electron blocking layer, wherein said first host material layer is intermixed with a first guest luminescent material so as to cast a first color light source under a bias voltage;

a second host material layer formed on the topside of said first host material layer, wherein said second host material layer is intermixed with a second guest luminescent material so as to cast a second color light source under said bias voltage;

a third host material layer formed on the topside of said second host material layer, wherein said third host material layer is intermixed with a third guest luminescent material so as to cast a third color light source under said bias voltage;

a hole blocking layer formed on the topside of said third host material layer;

an electron transmission layer formed on the topside of said hole blocking layer; and a cathode formed on the topside of said electron transmission layer.

15. The organic EL device as recited in claim 14, further comprising a transparent substrate formed on a bottom surface of said anode.

16. The organic EL device as recited in claim 14, wherein said first host material layer is an NPB layer, said second host material layer is a DPVBi layer, and said third host material layer is an Alq3 layer.

17. The organic EL device as recited in claim 14, wherein said first color light source is red, said second color light source is blue, and said third color light source is green.

18. The organic EL device as recited in claim 14, wherein said first guest luminescent material is selected from a group including a luminescent medium, a phosphorescent medium and combination thereof.

19. The organic EL device as recited in claim 14, wherein said second guest luminescent material is selected from a group including a luminescent medium, a phosphorescent medium and combination thereof.

20. The organic EL device as recited in claim 14, wherein said third guest luminescent material is selected from a group including a luminescent medium, a phosphorescent medium and combination thereof.

21. The organic EL device as recited in claim 14, wherein said hole blocking layer is a BCP layer.

22. The organic EL device as recited in claim 14, wherein said electron blocking layer is a LiF layer.

23. An organic electroluminescent (EL) device, comprising:

a transparent substrate;

an anode formed on the topside of said transparent substrate;

a hole injection layer formed on the topside of said anode;

a first NPB layer formed on the topside of said hole injection layer;

a LiF layer formed on the topside of said first NPB layer;

a second NPB layer formed on the topside of said LiF layer, wherein said second NPB layer is doped with DCM2 so as to cast a red light source under a bias voltage;

a DPVBi layer formed on the topside of said second NPB layer, wherein said DPVBi layer is doped with DSA so as to cast a blue light source under said bias voltage;

an Alq3 layer formed on the topside of said DPVBi layer, wherein said Alq3 layer is doped with C6 so as to cast a green light source under said bias voltage;

a BCP layer formed on the topside of said DPVBi layer;

an Alq layer formed on the topside of said BCP layer;

an electron injection layer formed on the topside of said electron transmission layer; and a cathode formed on the topside of said electron injection layer.

24. The organic EL device as recited in claim 23, wherein said hole injection layer is an M-MTDATA layer.

25. The organic EL device as recited in claim 23, wherein said electron injection layer is a LiF layer.

* * * * *